United States Patent [19]

Balaban et al.

[11] 4,282,549
[45] Aug. 4, 1981

[54] PULSE GENERATOR FOR A HORIZONTAL DEFLECTION SYSTEM

[75] Inventors: Alvin R. Balaban, Lebanon; Steven A. Steckler, Clark, both of N.J.

[73] Assignee: RCA Corporation, New York, N.Y.

[21] Appl. No.: 102,575

[22] Filed: Dec. 11, 1979

[51] Int. Cl.$^3$ .............................................. H04N 5/06
[52] U.S. Cl. .................................. 358/150; 307/265; 307/269; 328/59; 328/63
[58] Field of Search ............... 358/148, 150, 153, 154, 358/158, 352, 353; 307/261, 265–269, 106, 107, 108; 328/36, 58, 42, 59, 63, 66, 74, 72, 34

[56] References Cited

U.S. PATENT DOCUMENTS

| | | | |
|---|---|---|---|
| 3,039,066 | 6/1962 | Kenny | 331/113 |
| 3,862,437 | 1/1975 | Rossell | 307/352 |
| 3,898,484 | 8/1975 | Wilcox | 307/261 |
| 4,024,343 | 5/1977 | Cense | 358/148 |
| 4,126,815 | 11/1978 | Ahmed | 315/384 |

Primary Examiner—John C. Martin
Assistant Examiner—Michael A. Masinick
Attorney, Agent, or Firm—P. J. Rasmussen; W. H. Meagher; W. B. Yorks, Jr.

[57] ABSTRACT

A pulse generator is provided which may be advantageously used to produce a deflection drive signal in a television receiver. A capacitor is initially charged to a reference voltage level. Prior to the time at which the output pulse is to be generated, the capacitor is charged from a current source for a known time duration at a first rate. At the end of the charging interval, the capacitor has accumulated a known increment of charge proportional to the charge interval, and a new voltage level is established across the capacitor. The generator is now prepared to produce an output pulse. At a subsequent time, when the output pulse is needed, the capacitor is discharged at a second rate by a second current source. During the time interval that the second current source is discharging the capacitor, an output pulse is produced by the generator. A sensing circuit monitors the charge condition of the capacitor, and when it detects that the capacitor has been discharged to the initial reference voltage level, the sensing circuit disconnects the discharging current source from the capacitor, thereby terminating the output pulse.

10 Claims, 3 Drawing Figures

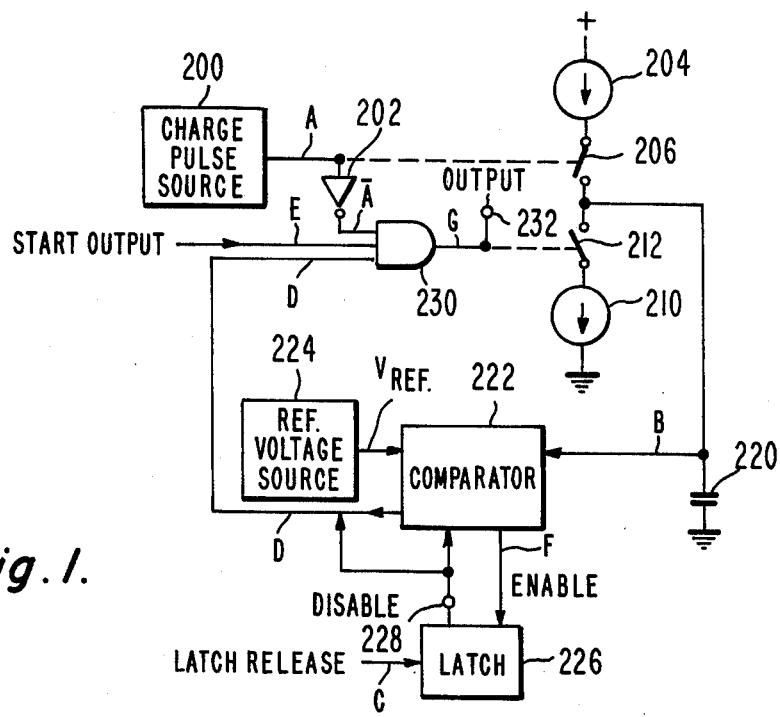
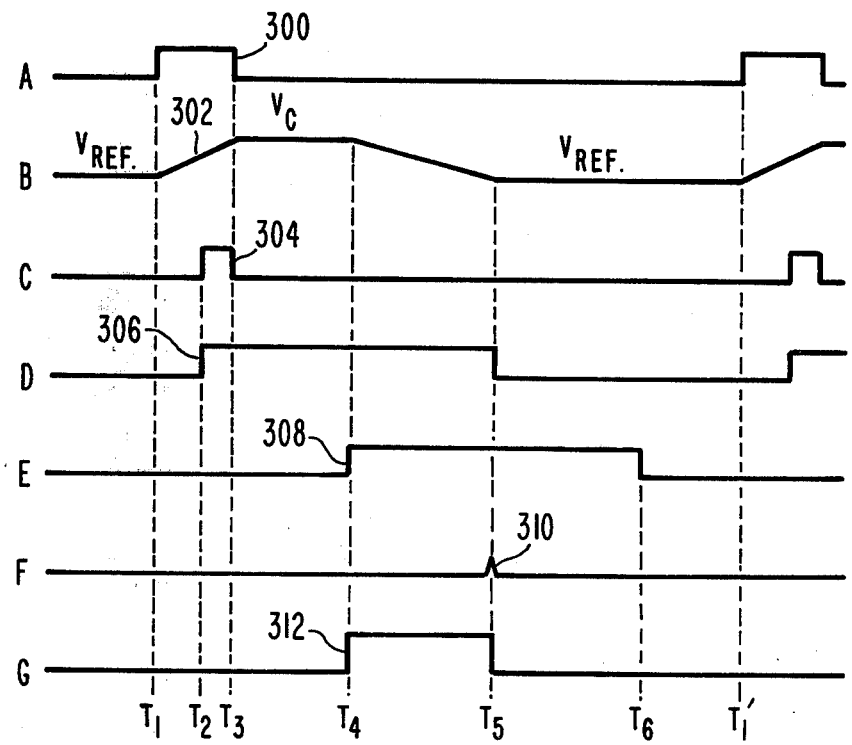
Fig.1.
Fig.2.

PULSE GENERATOR FOR A HORIZONTAL DEFLECTION SYSTEM

This invention relates to pulse generators and, more particularly, to a pulse generator which produces pulses of substantially constant time duration for driving a horizontal deflection system in a television receiver.

The horizontal deflection system in a television receiver must produce precisely controlled voltage and current waveforms to drive the horizontal deflection winding. The voltage and current waveforms are necessary to create a complex and precisely timed sequence of energy transfers in the deflection system during the trace and retrace intervals of each horizontal scan across the face of the kinescope. The sequence of energy transfers is initiated for each horizontal line by a horizontal drive signal, which is related to the horizontal synchronizing pulses of the received television signal, as well as line-to-line variations, such as beam current loading and device delays. If timing of these energy transfers is not tightly controlled, the displayed horizontal line can be longer or shorter than desired, and high voltage and current conditions can rapidly develop in the deflection system, which can lead to component failure, excessive power dissipation, and decreased receiver efficiency. Therefore, in order to maintain the timing accuracy and proper energy transfer conditions of the horizontal deflection system, it is necessary to supply a precisely defined horizontal drive signal to the deflection system for each horizontal line.

While a particular horizontal deflection system will have its own unique requirements as to the timing and duration of the horizontal drive signal, different deflection systems will have differing requirements. Thus, it is desirable, in the design of horizontal drive signal circuits, to provide a means for simply modifying the circuit to permit its use with different horizontal deflection systems with varying drive signal requirements. In the case of a horizontal drive signal circuit which is fabricated in integrated circuit form, it is desirable to be able to effect such a modification by the substitution of one or a very few components located external to the integrated circuit device.

Moreover, in addition to allowing for simple modification, the components which are located external to the integrated circuit should be inexpensive. One cost-determining characteristic of electronic components is the tolerance of the components; as a rule, the tighter the tolerance, the more expensive the component. It is therefore desirable to be able to use inexpensive circuit components with wide tolerances, while at the same time maintaining the precision of the drive signal which is produced by the drive signal circuit.

In accordance with the principles of the present invention, a pulse generator is provided which may be advantageously used to produce a horizontal drive signal in a television receiver. A capacitor is initially charged to a reference voltage level. Prior to the time at which the output pulse is to be generated, the capacitor is charged from a current source for a known time duration at a first rate. At the end of the charging interval, the capacitor has accumulated a known increment of charge proportional to the charge interval, and a new voltage level is established across the capacitor. The generator is now prepared to produce an output pulse. At a subsequent time, when the output pulse is needed, the capacitor is discharged at a second rate, by a second current source. During the time interval that the second current source is discharging the capacitor, an output pulse is produced by the generator. A sensing circuit monitors the charge condition of the capacitor, and when it detects that the capacitor has been discharged to the initial reference voltage level, the sensing circuit disconnects the discharging current source from the capacitor, thereby terminating the output pulse.

The pulse generator may be advantageously manufactured in integrated circuit form. If desired, the capacitor and one or more resistive elements of the current sources may be employed as discrete elements, separate from the integrated circuit, to permit the value of these elements to be independently selected. By varying the values of the resistive elements, the duration of the output pulse may be readily altered. In addition, since the accuracy of the output pulse duration is dependent upon the ratios of the charging and discharging currents rather than voltage level differences, an inexpensive, wide tolerance capacitor may be used. The current ratio is tightly controlled by precision current sources, thereby assuring that the output pulse will have a precisely defined duration.

In a preferred embodiment of the present invention, the pulse generator includes a latch circuit coupled to the second current source and the sensing circuit. The latch circuit disables the discharging current source during the beginning of the charging interval, and also disables the sensing circuit unless the capacitor has been charged to a level in excess of the initial reference voltage level.

In the drawings:

FIG. 1 illustrates in block diagram form a pulse generator constructed in accordance with the principles of the present invention;

FIG. 2 illustrates waveforms describing the operation of the pulse generator of FIG. 1.

Figure 3:
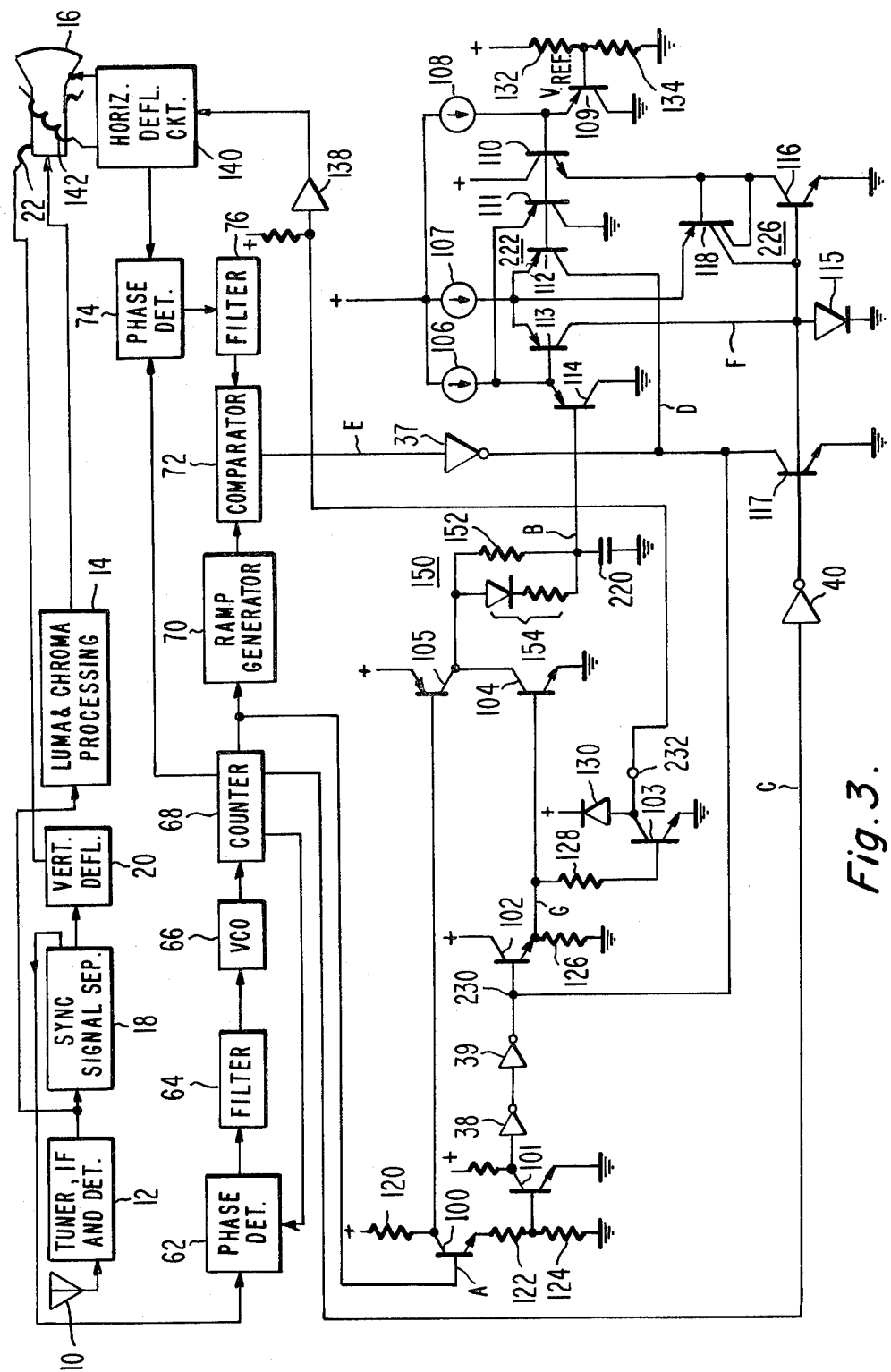
FIG. 3 illustrates, partially in block diagram form and partially in schematic diagram form, a television receiver containing a pulse generator of the present invention which produces drive pulses for the horizontal deflection system.

Referring to FIG. 1, a capacitor 220 is alternately charged and discharged from current sources 204 and 210 by closing switches 206 and 212, respectively. Current source 204, switches 206 and 212, and current source 210 are serially coupled between a source of supply potential (+) and a point of reference potential (ground). Capacitor 220 is illustratively shown referenced to ground by its coupling between the junction of the switches and ground, although it is to be understood that the capacitor may be referenced to a different source, such as the + supply. A charge pulse source 200 supplies a pulse of known duration on a conductor A, which acts to close the switch 206, thus charging the capacitor 220 from the current source 204. The pulse on conductor A is also inverted by a gate 202 and applied to one input $\overline{A}$ of an AND gate 230.

The capacitor 220 is also coupled to a comparator 222 which, when enabled, compares the voltage across the capacitor 220 with a reference voltage $V_{ref}$ which is supplied by a reference voltage source 224. The comparator 222 supplies a second input signal to AND gate 230 by way of a conductor D, and enables a latch circuit 226 by way of a conductor F. When the latch 226 is enabled, it produces an output signal at a terminal 228 which disables comparator 222 and conductor D. The enabled latch is released by a latch release signal which is applied to the latch by way of a conductor C.

The AND gate 230 receives a third input signal, a start output signal, by way of a conductor E. When all three inputs to the AND gate 230 are simultaneously in an enabling condition (e.g., high), the gate produces an output pulse on a conductor G, which is coupled to an output terminal 232. The output pulse is also effective to close switch 212 for the duration of the pulse, which discharges the capacitor 220 through the current source 210.

The operation of the pulse generator of FIG. 1 is illustrated by the waveforms of FIG. 2. At time $T_1$, a pulse 300 is produced by the charge pulse source 200 on conductor A, which closes the switch 206. The current source 204 then begins to charge capacitor 220 from its initial reference level $V_{ref}$ as shown in FIG. 2B. The pulse 300 is also inverted by gate 202 and applied in inverted form to one input of AND gate 230, which disables gate 230 during the charging interval. When the charging pulse 300 terminates at time $T_3$, switch 206 opens, and the capacitor 220 is charged to a new level $V_c$ as illustrated by waveform 302.

At a time $T_2$ after the charging interval has commenced, a latch release pulse 304 is applied to the latch 226. This pulse releases the latch, and the disabling signal is removed from the comparator and conductor D. The comparator 222, which is now enabled, compares the reference voltage $V_{ref}$ from the reference voltage source 224 with the voltage across the capacitor 220. Since the capacitor voltage is higher than $V_{ref}$ at this time, the comparator applies a positive-going signal to conductor D, as illustrated by waveform 306 of FIG. 2D. Although the latch release pulse 304 is illustratively shown as occurring during the latter half of the charging pulse 300, it is only necessary that this pulse begin after time $T_1$ and before time $T_4$, and end before time $T_5$.

At a time subsequent to $T_3$, a start output signal 308 is applied to the conductor E at the input of AND gate 230. At this time, conductors $\overline{A}$ and D are also in an enabled state, and the occurrence of the start output signal 308 will produce an output signal 312 on conductor G as illustrated in the waveform of FIG. 2G. The output signal appears at terminal 232, and effectively closes switch 212, which connects the discharging current source 210 to the capacitor 220. The capacitor 220 now begins to discharge toward its initial level $V_{ref}$, as shown in FIG. 2B. The time required for this discharge to transpire determines the duration of the output pulse 312.

Comparator 222 monitors the discharging of the capacitor 220, and senses when the capacitor has been discharged back to its starting condition $V_{ref}$ at time $T_5$. At this time, the comparator produces an enabling pulse 310 on conductor F to enable the latch 226, and also disables the positive-going signal on conductors F and D, as illustrated in FIGS. 2F and 2D. The signal level on conductor D (now low) disables AND gate 230, which terminates the output signal on conductor G and opens switch 212. The discharging of the capacitor 220 then stops, with the initial voltage level $V_{ref}$ established across the capacitor. The enabled latch produces a disabling pulse at terminal 228, which clamps conductor D in its present disabling state, and also disables the comparator and its outputs. The latch enabling pulse 310 on conductor F is thereby terminated. It should be pointed out that the duration of the latch enabling pulse 310 of FIG. 2F is exaggerated for illustration purposes; in actuality, this pulse lasts only for the time required to switch the latch into conduction, which is essentially the switching time of two transistors.

At some later time $T_6$, the start output signal 308 ends. The occurrence of time $T_6$ is not critical, as it is only necessary for this signal to last for the duration of the discharging interval $T_4$ - $T_5$. The accuracy of the system may be ensured by ending signal 308 prior to the beginning $T_1'$ of the next charging interval.

Under carefully controlled conditions, the latch 226 is not necessary for the operation of the pulse generator. Inclusion of the latch 226, however, allows greater flexibility in the selection of the source of the start output signal which appears on conductor E. For instance, if the latch 226 were not used, and the start output signal was supplied by a source which did not terminate the signal immediately after the discharging interval $T_4$ - $T_5$, a slight supply voltage fluctuation could cause a reduction in the reference level $V_{ref}$. Under these conditions, the comparator would apply an enabling signal level to conductor D. Hence, conductors $\overline{A}$, D and E would all be in an enabling state, and an undesired output signal would be produced on conductor G, closing switch 212 and discharging the capacitor. An erroneous output signal would be produced, and the next controlled output signal would accordingly be of less than the desired duration. Also, a "race" condition would occur, during which switch 206 would be closed to charge the capacitor by the charge pulse before the charge pulse could propagate through gate 202 to disable the AND gate 230. During the race, the two current sources would be connected to each other across the supply potential, which could lead to component failure.

The above-described undesirable conditions are prevented by the use of the latch 226. When enabled, the latch disables conductor D and hence AND gate 230 from the end of an output pulse until the latch release signal is applied following the beginning of the next charging interval. Thus, the latch 226 does not enable conductor D and the comparator 222 until after the signal on conductor $\overline{A}$ has disabled AND gate 230. Erroneous discharge situations prior to time $T_1$, and race conditions at the moment the charge pulse is applied, are thereby prevented.

FIG. 3 illustrates the video signal processing portion of a television receiver containing a pulse generator constructed in accordance with the principles of the present invention for supplying a drive signal to the horizontal deflection circuit. Video signals are received by an antenna 10 and applied to a tuner, intermediate frequency and video detector stage 12. The detected video signals are applied to luminance and chrominance processing circuitry 14, which supplies video drive signals to a kinescope 16. The detected video signals are also applied to a synchronizing signal separating circuit 18, which separates horizontal and vertical sync signals from the video information. The sync signals are coupled to a vertical deflection circuit 20, which generates vertical deflection signals for a deflection winding 22 located on the neck of the kinescope. The sync separator supplies horizontal sync signals to a phase detector 62.

The phase detector 62, a filter 64, a voltage controlled oscillator 66, and a counter 68 are coupled in a phase locked loop to develop output signals which are substantially free of noise and locked in phase and frequency to the incoming horizontal sync signals. Output signals from the counter 68 are applied to a second phase detector 74 and to a ramp generator 70, the latter producing a sawtooth waveform at the horizontal sync pulse frequency. The phase detector 74 compares the horizontal sync locked pulses from the counter 68 with flyback pulses from a horizontal deflection circuit 140 and develops an output voltage which is filtered by a filter 76 and applied to one input of a comparator 72. The comparator 72 compares the filtered voltage with the sawtooth waveform developed by ramp generator 70 to determine the time at which the pulse generator is to provide a drive signal to the horizontal deflection circuit 140. In response to the horizontal drive signals, the horizontal deflection circuit 140 develops deflection waveforms which are applied to the deflection windings, and produces a high ultor voltage which is applied to the kinescope as a beam accelerating potential.

A pulse generator of the present invention is represented schematically in FIG. 3 and bears the same reference numerals and letters as many of the corresponding elements shown in FIG. 1. A horizontal rate charge command signal is applied to the base of a transistor 100 from counter 68 by way of conductor A. The collector of transistor 100 is coupled to a source of supply potential (+) by a resistor 120, and to the base of a charging current source transistor 105. The emitter of transistor 100 is coupled to ground by resistors 122 and 124. The junction of resistors 122 and 124 is coupled to the base of a transistor 101, the emitter of which is coupled to ground and the collector of which is coupled to the input of an inverter 38. The output of inverter 38 is coupled to the input of inverter 39, the output of which is coupled to the base of a transistor 102 at a terminal 230. The collector of transistor 102 is coupled to the + supply and the emitter of the transistor is coupled to ground by a resistor 126, to the base of an output transistor 103 by a resistor 128, and to the base of a discharge current source transistor 104.

Charging current source transistor 105 and discharge current source transistor 104 have their collector-to-emitter paths serially coupled between the + supply and ground, with the emitter of transistor 105 coupled to the + supply and the emitter of transistor 104 coupled to ground. The joined collectors of the two transistors are coupled to one plate of a capacitor 220 by a current source impedance 150. The remaining plate of capacitor 220 is coupled to ground. The current source impedance comprises two parallel paths. One path includes a resistor 152, and the other path 154 includes a resistor and a diode poled for conduction from the current source transistors to the capacitor 220.

The voltage across the capacitor 220 is applied across the base-to-collector path of a transistor 114. The collector of transistor 114 is coupled to ground, and its emitter is coupled to a current source 106, the base of a transistor 113, and the emitter of a transistor 111. Transistor 113 and a transistor 112 comprise a comparator 222. The two transistors are coupled at their emitters and to a current source 107. The base of transistor 112 is coupled to the bases of transistors 111 and 110, to a current source 108, and to the emitter of a transistor 109. The collectors of transistors 111 and 109 are coupled to ground, and the collector of transistor 110 is coupled to the + supply. Current sources 106, 107 and 108 are connected in common to the + supply. Transistor 109 has a reference voltage $V_{ref}$ applied to its base from the junction of a voltage divider including resistors 132 and 134, which are serially coupled between the + supply and ground.

A latch circuit 226 includes a diode 115 and transistors 116, 117 and 118. Transistor 118 has an emitter coupled to the emitters of the comparator transistors 113 and 112, a first collector coupled to the base of transistor 116, and a second collector coupled to the collector of transistor 116 and the base of the transistor 118. Collector current is supplied to the collector of transistor 116, in addition to that provided by the base and second collector of transistor 118, from the emitter of transistor 110. The emitter of transistor 116 is coupled to ground. The anode of diode 115 is coupled to the collector of comparator transistor 113 and the base of transistor 116, and the cathode of the diode is coupled to ground. The base of transistor 116 is also coupled to the base of transistor 117 and to the output of an inverter 40. The input of inverter 40 is coupled to an output of the counter 68, which supplies a latch release pulse to the latch. The collector of transistor 117 is coupled to the junction of the collector of comparator transistor 112, the output of a buffer amplifier 37, and terminal 230 at the base of transistor 102. The input of the buffer amplifier 37 is coupled to an output of comparator 72, which supplies a start output signal to the pulse generator.

The output transistor 103 has its emitter coupled to ground and its collector coupled to the + supply by a diode 130 and to an output terminal 232. The output signal at terminal 232 is supplied to the horizontal deflection circuit 140 by an amplifier 138.

The pulse generator of FIG. 3 will provide a horizontal drive signal for the horizontal deflection circuit when commanded to do so by comparator 72. Prior to this time, a charging pulse is applied to transistor 100 by the counter 68 and conductor A. In the embodiment of FIG. 3, the charging pulse has a duration of eight microseconds and occurs generally during the horizontal retrace interval in synchronism with the incoming horizontal sync signal. The charging pulse causes transistor 100 to begin conducting current, thereby switching on the charging current source transistor 105. The current conducted by transistor 105 charges capacitor 220 by way of the charging impedance 150. The direction of current flow forward biases the diode in impedance path 154, and the capacitor 220 is therefore charged by the flow of current through both source impedance paths 152 and 154.

The charging pulse at the base of transistor 100 is also applied to the base of transistor 101, and appears in inverted form at terminal 230. The inverted pulse maintains transistor 102 in a nonconducting condition, which in turn, prevents discharge current source transistor 104 from switching on. The possibility of a race condition as the charging pulse attempts to disable transistors 102 and 104 before it enables transistor 105 is prevented by operation of the latch circuit 226, which is enabled prior to the charging pulse interval. When the latch circuit 226 is conducting, transistor 117 is also conducting, which effectively disables transistor 102 and hence the discharge current source transistor 104.

At approximately the middle of the charging pulse interval, the counter 68 applies a short duration pulse to inverter 40 by way of conductor C. The inverted pulse at the output of inverter C turns off transistor 117, which conditions conductor D for a subsequent rise to a high, enabling state. The inverted pulse also turns off transistors 116 and 118, which releases the latch. Until this time, transistor 118 has been conducting the current supplied by current source 107, which disabled the comparator 222. With the release of the latch, the comparator is now enabled, and begins to compare the increasing voltage on capacitor 220 with the reference voltage level $V_{ref}$ at the base of transistor 109. Transistors 114 and 109 translate these voltages to the bases of transistors 113 and 112, and the higher capacitor voltage causes transistor 113 to turn off and transistor 112 to turn on. Conduction by transistor 112 supplies base current to transistor 102 by way of conductor D. However, conductor D and terminal 230 at the base input of transistor 102 are held in a low, disabling condition at this time by the inverted charging pulse produced by inverter 39.

At the end of the eight microsecond charging pulse interval, transistor 100 is turned off, as is the charging current source transistor 105. The termination of the charging pulse also causes the output of inverter 39 to release from its low, disabling state. However, terminal 230 is still in a low, disabling condition due to the low output of the amplifier 37. The system is now ready to produce an output pulse upon command by comparator 72.

After capacitor 220 has been charged and transistor 105 has turned off, the charge stored on capacitor 220 remains undisturbed until the start of the output and discharge interval. Transistors 104 and 105 are off at this time, and the capacitor sees the high impedance of the collector electrodes of these nonconducting transistors. No current will flow from the capacitor to the base of transistor 114 at this time, because conduction by transistor 111 is diverting the current supplied by current source 106 away from the emitter of transistor 114, thereby disabling transistor 114. Thus, the known increment of charged stored on capacitor 220 during the charging interval does not change as the pulse generator awaits the output command.

At the proper time, the comparator 72 will make the comparison which sends an output pulse command to amplifier 37 by way of conductor E. Terminal 230 will thus be in a high, enabling condition, and base current for transistor 102 will be supplied by transistor 112, turning on transistor 102. Transistor 103 is turned on, applying an output pulse to terminal 232, which is then coupled to the horizontal deflection circuit 140 by buffer amplifier 138. Conduction by transistor 102 also turns on the discharge current source transistor 104, which begins to discharge the capacitor 220 through the source impedance 150. Discharge current will only flow through resistor 152, since the current flow back biases the diode in path 154. The discharging of the capacitor 220 will thus have a duration which is longer than the eight microsecond charging interval, thereby producing an output pulse of the required pulse width.

The decreasing voltage across the capacitor 220 is translated to the comparator 222 by transistor 114, and the comparator will monitor the discharging. When the capacitor voltage returns to the initial level $V_{ref}$, the comparator 222 switches; transistor 113 turns on and transistor 112 turns off. The cessation of conduction by transistor 112 removes the source of base current for transistor 102, and that transistor will begin to turn off, thereby ending the output pulse and turning off the discharge current source transistor 104. Simultaneously, the collector current of transistor 113 is coupled to the latch circuit 226 by conductor F, which turns on transistor 117 and the latch transistors 116 and 118. Transistor 117 then clamps terminal 230 to approximately ground potential, which maintains transistor 102 in its nonconducting state. Conduction by the latch transistor 118 again draws the current from source 107 away from the emitters of the comparator transistors 113 and 112, thereby disabling the comparator 222. Thus, it is seen that the discharging of capacitor 220 is halted when the capacitor returns to its initial condition of voltage level $V_{ref}$. The pulse generator then awaits the next charging and discharging cycle.

The pulse generator of FIG. 3 may be conveniently manufactured in integrated circuit form, along with phase locked loop and output pulse command elements 62, 66, 68, 70, 72 and 74. External components may be used for the current source impedance 150 and the capacitor 220, thereby providing a simple means for adjusting the output pulse width. For example, the output pulse width may be increased by decreasing the value of the resistor in the path 154. Further control over the output pulse width may be obtained by changing the polarity of the diode in path 154, removing the diode, or adding a diode in series with resistor 152. Moreover, since the accuracy of the output pulse duration is dependent upon the precision to which the ratio of charging current to discharging current can be maintained, the pulse generator is relatively unaffected by variations in the value of the capacitor 220. The arrangement of FIG. 3 has been constructed and tested, and it has been found that an inexpensive 10 percent tolerance capacitor may be used with 2 percent tolerance resistors in the source impedance 150 to produce output pulses with approximately a 2 percent accuracy in pulse duration. Thus, it is the precision of the relatively inexpensive resistors which governs the accuracy of the system, rather than the precision of the relatively more expensive capacitor.

What is claimed is:

1. A pulse generator for producing an output pulse of a known duration in response to a command signal comprising:
    a charge storage device;
    a source of current control pulses having a fixed duration;
    first means, responsive to said control pulses, and coupled to said charge storage device, for maintaining a current flow of a first polarity to said charge storage device continuously during the occurrence of said control pulses to alter the charge of said device from a first charge condition to a second charge condition;
    second means, coupled to said charge storage device, for providing a current flow of a second polarity to said charge storage device for an interval initiated in response to said command signal and terminated in response to the attainment by said charge storage device of said first charge condition; and
    means, coupled to said second means, for producing an output pulse during said interval.

2. The pulse generator of claim 1, further comprising a latch circuit coupled to said second means and responsive to enabling and release signals for disabling said second means for a period commencing after said interval has terminated and ending after the initiation of the succeeding current control pulse.

3. The pulse generator of claim 2, wherein said enabling signal is developed by said second means and said release signal is developed by said source of current control pulses.

4. The pulse generator of claim 3, wherein said current control pulses are further applied to said second means to inhibit said second means during said occurrence of said control pulses.

5. The pulse generator of claim 2, further comprising a source of reference voltage and wherein said second means includes a comparator having a first input coupled to said reference voltage source and a second input coupled to said charge storage device for detecting when the voltage developed by said charge condition of said device is substantially equal to said reference voltage.

6. The pulse generator of claim 5, wherein said charge storage device comprises a capacitor having a first plate coupled to one terminal of a source of supply voltage and a second plate, and said first and second means include first and second transistors having their collector-to-emitter paths serially coupled across two terminals of said source of supply voltage, the base of said first transistor being coupled to said source of current control pulses and the base of said second transistor being coupled to said comparator and to receive said command signal, and a resistive impedance coupled between the junction of said serially coupled transistors and said second plate of said capacitor.

7. The pulse generator of claim 6, wherein said resistive impedance comprises the series combination of a diode and a first resistor, and a second resistor coupled in parallel with said series combination.

8. In a television receiver, including a source of composite video signals; first means, coupled to said source of signals, for separating horizontal synchronizing signals from said composite video signals; second means, coupled to said horizontal synchronizing signal separating means, for producing pulses related in phase and frequency to said horizontal synchronizing signals; a horizontal deflection circuit, responsive to horizontal drive signals, for producing deflection and flyback signals; and third means, coupled to said second means, and responsive to said flyback signals and pulses from said second means for producing, at an output, a horizontal drive command signal; a horizontal drive signal circuit comprising:

a capacitor;
a charging transistor having an input electrode coupled to said second means and an output electrode coupled to said capacitor for charging said capacitor in response to pulses from said second means;
a source of reference voltage;
a comparator having a first input coupled to said reference voltage source, a second input coupled to said capacitor, and an output;
means, coupled to the output of said comparator and to the output of said third means, and having an output for developing a discharge signal in response to said horizontal drive command signal;
a discharging transistor having an input electrode coupled to the output of said discharge signal developing means for discharging said capacitor during the occurrence of said discharge signal; and
means, having an input coupled to said discharge signal developing means and an output coupled to said horizontal deflection circuit for applying a horizontal drive signal to said horizontal deflection circuit which corresponds to said discharge signal.

9. The television receiver of claim 8, wherein said horizontal drive signal circuit further comprises a latch circuit having a first input coupled to said third means, a second input coupled to said comparator, and an output coupled to said comparator for disabling said comparator during a period subsequent to said discharging interval and prior to the occurrence of the succeeding interval during which said capacitor is charged by said charging transistor.

10. A method for producing output pulses of substantially constant duration in response to an output command signal comprising the steps of:
(a) charging a capacitor from an initial voltage condition for a given time duration from a first current source of a known impedance;
(b) discharging said capacitor by a second current source of a known impedance in response to said output command signal; while
(c) monitoring the voltage condition of said capacitor until said initial voltage condition is reached, and then
(d) disabling the second current source to stop the discharge of the capacitor at the initial voltage condition, while
(e) producing an output pulse during the time that the capacitor is being discharged.

* * * * *